(12) United States Patent
Houk et al.

(10) Patent No.: US 7,714,550 B2
(45) Date of Patent: May 11, 2010

(54) SYSTEM AND METHOD FOR TRACKING A VARIABLE CHARACTERISTIC THROUGH A RANGE OF OPERATION

(75) Inventors: Talbott M. Houk, Monte Sereno, CA (US); Joseph Duncan, Palo Alto, CA (US); Eugene L. Cheung, Fremont, CA (US)

(73) Assignee: Linear Technology Corporation, Milipitas, CA (US)

( * ) Notice: Subject to any disclaimer, the term of this patent is extended or adjusted under 35 U.S.C. 154(b) by 87 days.

(21) Appl. No.: 11/253,697

(22) Filed: Oct. 20, 2005

(65) Prior Publication Data

US 2006/0164065 A1 Jul. 27, 2006

Related U.S. Application Data

(60) Provisional application No. 60/645,607, filed on Jan. 24, 2005.

(51) Int. Cl.
 *G05F 1/44* (2006.01)
(52) U.S. Cl. .......................... 323/272; 323/906; 307/51
(58) Field of Classification Search .................. 363/95, 363/98, 55, 79, 80; 323/268, 271, 272, 906, 323/284; 307/66, 43, 44, 45–48; 320/101, 320/102, 145, 151
 See application file for complete search history.

(56) References Cited

U.S. PATENT DOCUMENTS 3,384,806 A  5/1968  Hartman
4,175,249 A  11/1979  Gruber
4,341,607 A  7/1982  Tison
4,404,472 A * 9/1983  Steigerwald .................. 307/46
4,580,090 A  4/1986  Bailey et al.
4,873,480 A * 10/1989  Lafferty ...................... 323/299
5,293,447 A  3/1994  Fanney et al.
5,327,071 A * 7/1994  Frederick et al. ............ 323/299

(Continued)

FOREIGN PATENT DOCUMENTS

EP       0 895 146 A1       2/1999
WO    WO 2005/069096 A1    7/2005

OTHER PUBLICATIONS

Niebauer, M et al., Solarenergie optimal nutzen Intelligentes MPP-Tracking mit einem ST62-Mikrocontroller, Elektronik, Weka Fachzeitschriftenverlag, Poing, DE, vol. 45, No. 16, Aug. 6, 1996, pp. 86-89, XP000622027, ISSN: 0013-5658.

(Continued)

*Primary Examiner*—Rajnikant B Patel
(74) *Attorney, Agent, or Firm*—McDermott Will & Emery LLP

(57) ABSTRACT

An analog control circuit is coupled to an apparatus having a variable characteristic over an operating range. A sensing circuit is coupled to the apparatus and the control circuit during the range of operation of the apparatus and is operative to sense the variable characteristic. The operating parameter of the apparatus is controlled to be set at a level corresponding to a prescribed criterion, which may be a maximum or minimum, of the characteristic sensed over the range of operation.

31 Claims, 8 Drawing Sheets

U.S. PATENT DOCUMENTS

| | | | |
|---|---|---|---|
| 5,604,430 A | | 2/1997 | Decker et al. |
| 5,801,519 A | * | 9/1998 | Midya et al. ................ 323/222 |
| 6,281,485 B1 | * | 8/2001 | Siri ......................... 250/203.4 |
| 6,369,462 B1 | * | 4/2002 | Siri ............................. 307/51 |
| 6,433,522 B1 | * | 8/2002 | Siri ............................ 323/272 |

OTHER PUBLICATIONS

Sullivan, Charles, R., et al. "A High-Efficiency Maximum Power Point Tracker for Photovoltaic Arrays in a Solar-Powered Race Vehicle." pp. 574-580.

Shu-Hung, Henry., et al. "A Novel Maximum Power Point Tracking Technique for Solar Panels Using a SEPIC or Cuk Converter." IEEE Transactions on Power Electronics, vol. 18, No. 3, May 2003, pp. 717-724.

European Office Action issued in European Patent Application No. EP 06 717 350.0-2206, dated on Jan. 25, 2008.

European Search Report and Written Opinion issued in European Patent Application No. EP 09 16 5453 dated Dec. 11, 2009.

* cited by examiner

SYSTEM AND METHOD FOR TRACKING A VARIABLE CHARACTERISTIC THROUGH A RANGE OF OPERATION

This application claims the benefit of U.S. Provisional Application No. 60/645,607, filed Jan. 24, 2005.

TECHNICAL FIELD

The present disclosure relates to global tracking of a maximum or minimum point of a characteristic that is variable over an operating range and control of the characteristic. More particularly, power output of a variable power energy source, such as a solar energy source is tracked and the maximum power output is converted.

BACKGROUND

Utilization of sustainable energy sources, as alternatives to petroleum sources, has become an increasingly important objective. Solar cells transform energy from an essentially unlimited source into useable electricity. The level of energy from the sun that is available at the solar cell location is variable in accordance with changing shade conditions and atmospheric effects. The optimum power point at which the solar cells can operate varies with these changing conditions. Direct connection of solar cells to batteries or inverters in grid-tie systems rarely allows optimum power transfer. The need thus exists for a maximum power point tracker that can facilitate load transformation of power from a solar source at its optimum power point operation.

A typical one hundred twenty watt solar panel contains forty eight photovoltaic cells connected in series, and bypass diodes connected in parallel with each group of twenty four cells. With uniform isolation and evenly distributed sunlight, a power-voltage curve can be obtained such as shown in FIG. 1a. The curve is derived by applying a voltage to the solar panel that is varied from zero (or short circuit condition) to a maximum (or open circuit condition) and detecting the power, as a function of current drawn over the voltage range. Maximum power is obtained at a clearly defined voltage level. Under partial shading conditions, however, there can exist multiple local maxima on the power-voltage or power-current curve of a solar panel. FIG. 1b is a power-voltage curve for the solar panel under weak partial shading. FIG. 1c is a power-voltage curve for the solar panel under strong partial shading. As all cells in the series chain must pass the same current, local maxima are created at each cell's optimum current level. As current increases, shaded cells are bypassed, cutting their power output, while power from the remaining cells increases.

Typical schemes for solar panel operation have ignored the problem of multiple global maxima, deeming such detection too difficult to solve without the use of expensive, complex elements such as analog to digital converters and microprocessors. One such approach would be to operate the solar panel at a set percentage of maximum voltage, based on an assumption that such voltage level approximates the point of maximum power output. However, with inevitable variability of sunlight conditions, operation will often be at less than maximum available power output.

The need exists for efficient and inexpensive tracking of a characteristic that is variable over an operating range and identifying a point in the range at which the characteristic is a maximum, or minimum. A particular need exists for a maximum power point tracker that can determine a global maximum power point and can avoid large space consuming hardware and costly complex components.

SUMMARY OF THE DISCLOSURE

These needs are met by a controlling an apparatus that has a characteristic that is variable over a range of operation. An analog control circuit is coupled to the apparatus and configured to adjust a level of an operating parameter of the apparatus. A sensing circuit is coupled to the apparatus and the control circuit during the range of operation of the apparatus and is operative to sense the variable characteristic. The operating parameter of the apparatus is controlled to be set at a level corresponding to a prescribed criterion, which may be a maximum or minimum, of the characteristic sensed over the range of operation.

A variable energy source is tracked to obtain maximum power output. The source is coupled to a converter capable of wide range of operation under control of a variable converter current control signal. In a search mode, the converter is operated to sweep through the entire range. The maximum power output of the converter and the converter current control signal value that produces the maximum power output are determined in order to identify a nominal peak converter current control point for subsequent converter operation. Thereafter, a dithering operation proceeds, initially at the identified nominal peak current control point. The power output of the converter thereafter is repeatedly sensed at sampled intervals. The converter current control is adjusted in accordance with sensed changes in power output.

During odd numbered sampled intervals, a first capacitor is charged in proportion to the converter power output. During even numbered sampled intervals, a second capacitor is charged in proportion to the converter power output. The voltage levels of the first and second capacitors are compared to determine whether power output has increased or decreased after a converter current control adjustment. A signal, which is generated in accordance with the determination for each comparison, is integrated and applied to a control input of the converter to adjust the converter current control value. At each adjustment, the level of current control signal is changed in either an upward or downward direction. In response to a determination of increased power output in the comparing step, the current control signal is changed in the same direction as the last previous adjustment. In response to a determination of decreased power output in the comparing step, the current control signal level is changed in the opposite direction to the last previous adjustment. Preferably, each peak converter current adjustment in the dithering mode is made in the same incremental amount in either direction.

In the search mode, the current control signal is varied over its entire range during a first phase while measuring power output of the converter. A value corresponding to the maximum measured power is stored during the first phase. In a second phase, the current control signal is increased while measuring the converter power output of the converter. When the measured power in the second phase approaches the stored maximum measured power of the first phase, the nominal peak current control signal value for the dithering mode has been identified and operation then switches to the dithering mode. Converter operation continuously alternates between the search mode and dithering mode. Each dithering mode operation is performed for a set time duration, preceded by relatively fast search mode sweeps to set a new nominal current control signal level at the maximum power point.

Although any converter can be used that is subject to duty cycle control, a voltage boost converter is preferred with operation at a constant frequency. A switching regulator includes a switch and a controller for activating the switch at a current control signal that is varied in accordance with the integrated signal applied at the control input. A power sensing stage and a control circuit is coupled between the load and the control input, respectively. The control circuit includes a maximum power tracking circuit coupled to the power sensing circuit for setting a nominal peak current control signal level corresponding to maximum power tracked and a dithering control circuit coupled to the power sensing circuit for adjusting the nominal current control signal level. A signal generating circuit is coupled to the maximum power tracking circuit and the dither control circuit for generating a control signal applied to the converter control input.

The power sensing stage preferably comprises a first storage device coupled to the load during a first sample interval for establishing a voltage level corresponding to load power during the first sample period and a second storage device coupled to the load during a second sample period for establishing a voltage level corresponding to load power during the second sample interval. A comparator, having inputs coupled to the first storage device and the second storage device, outputs a signal indicative of whether load power has increased or decreased.

The dithering control circuit comprises a logic circuit, coupled to the output of the comparator, that is configured to change states when the comparator output is indicative of a decrease in load power and to maintain its state when the comparator output is indicative of an increase in load power. The signal generating circuit comprises an integrator that is coupled to the output of the logic circuit.

The maximum power tracking circuit comprises a peak detector circuit and a supervisor module. The peak detector circuit comprises a first storage device coupled to the load during operation of the converter through a first sweep of a range of current control signals, for establishing a voltage level corresponding to maximum load power, and a second storage device coupled to the load during a second sweep of the current control signal range for storing a voltage level corresponding to the load power during the second sweep. The maximum power tracking circuit storage devices are each coupled to comparator inputs. The comparator changes output states when the voltage level of the second capacitor approaches the level of the first capacitor during the sweep of the second phase. The supervisor module comprises a logic circuit having a first output coupled to the first storage device for activating the first storage device, a second output coupled to the second storage device for activating the second storage device and a third output for resetting the peak detector circuit. The change of state of the comparator during the second phase generates a reset signal at the third output.

Additional advantages will become readily apparent to those skilled in this art from the following detailed description, wherein only the preferred embodiments are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Implementations of the present invention are illustrated by way of example, and not by way of limitation, in the figures of the accompanying drawings and in which like reference numerals refer to similar elements.

DETAILED DESCRIPTION

Figure 1A:
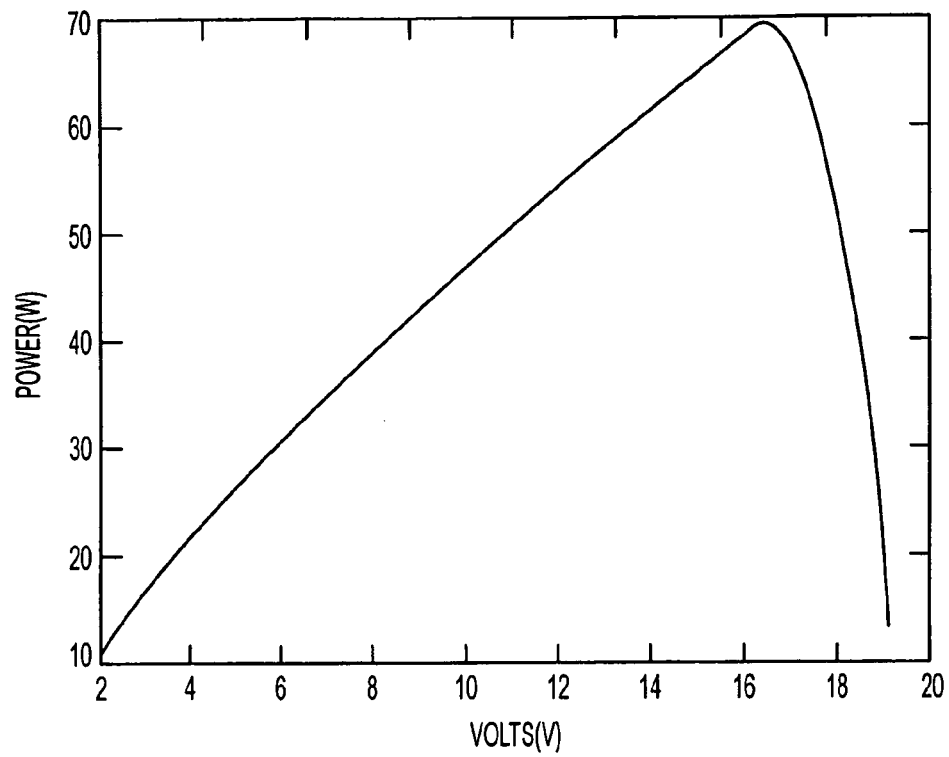
FIGS. 1*a*-1*c* are curves of power vs voltage for a typical solar panel for different sunlight conditions.
Figure 1B:
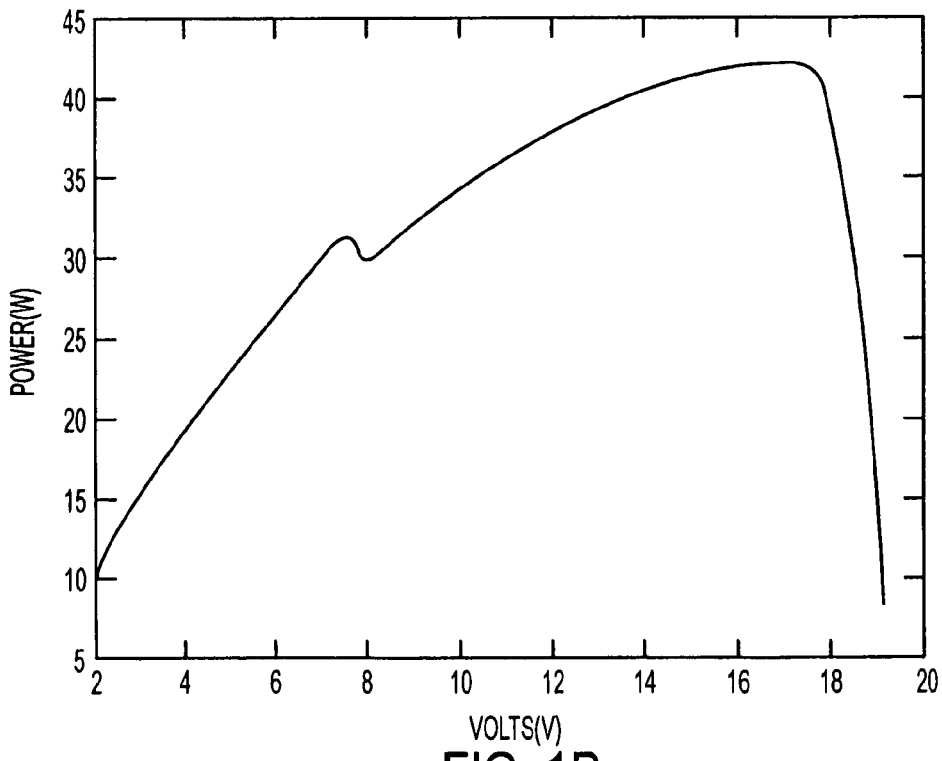
Figure 1C:
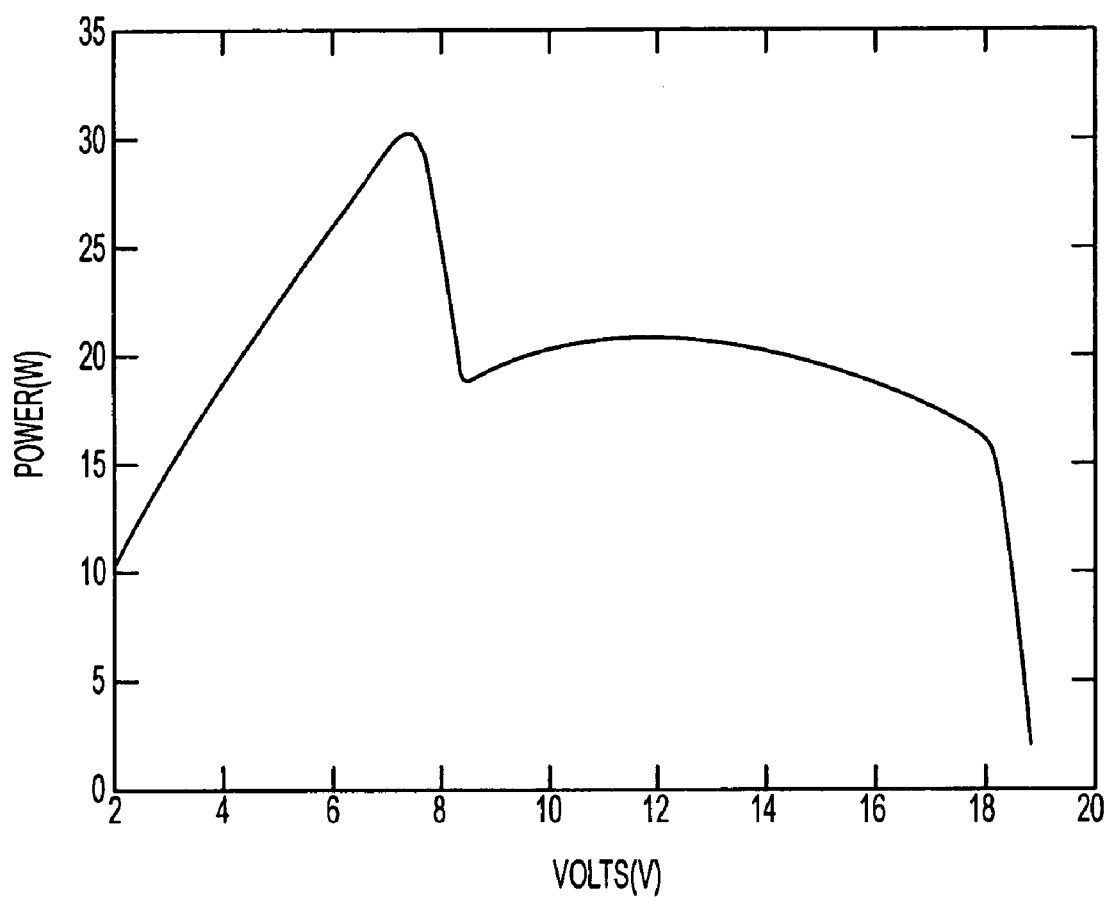
Figure 2:
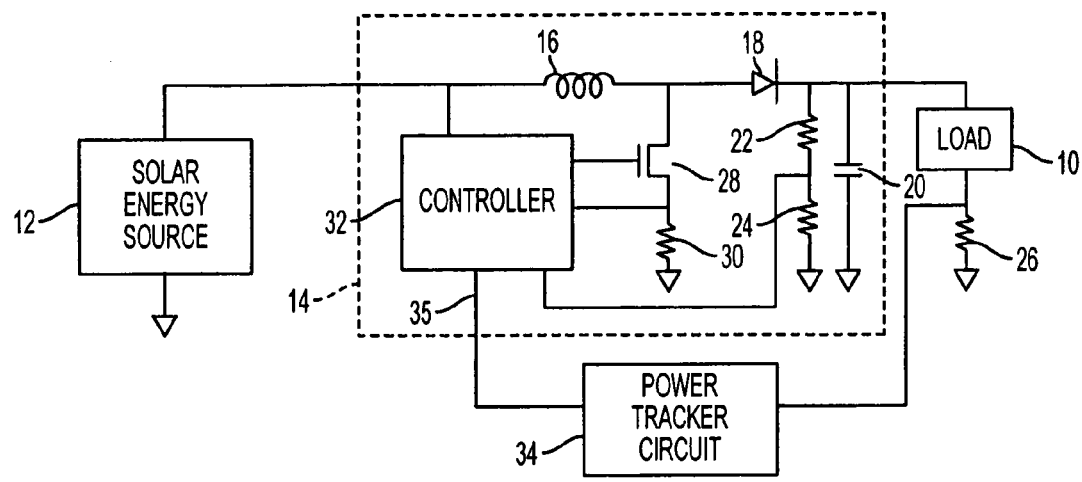
FIG. 2 is a schematic block diagram of a power tracking system in accordance with the present invention.

FIG. 2 is a block diagram of an exemplary system suitable to the present invention. The power made available to load 10 from solar energy source 12 can be maximized by operation of voltage regulator 14. Regulator 14 is exemplified as a voltage boost regulator, although other types of regulators may be employed. The input of regulator 14 is coupled between the solar energy source 12 and the load 10. Connected in series between the input and output terminals of the regulator are an inductor 16 and diode 18. Connected in parallel between the regulator output and the return path to the source are output capacitor 20 and the series connected resistors 22 and 24. Load current sensing resistor 26 is connected in series with the load 10. Controlled switch 28 and resistor 30 are connected between one end of inductor 16 and the return. Switch 28 preferably is a MOSFET, although any controlled switching device may be utilized. An input of controller 32 is coupled to the energy source 12. A power tracker circuit 34, to be more fully described later, is coupled between load current sensing resistor 26 and input 35 of controller 32. A junction between resistors 22 and 24 is connected to a voltage sensing input of the controller 32. Resistor 30 is connected to another input of controller 32. An output of controller 32 is connected to the control input of switch 28.

Controller may, for example, comprise a model LTC1871 controller, manufactured by Linear Technology Corporation. The controller may operate in a variable duty cycle mode, a variable frequency mode, or a constant pulse width mode in a known manner. In accordance with the various inputs, the controller outputs signals to the switch 28 to regulate the timing of its activation, and thus the current through inductor 16, to provide a voltage boost output. The voltage across resistor 24 is proportional to the output voltage and is applied to a load voltage input to the controller. The voltage across resistor 30 is proportional to the current through switch 28 and is applied to a switch current sense input to the controller 35. The voltage across resistor 26 is proportional to the load current and is indicative of load power. The output of the power tracker circuit 34 provides a signal to the input 35 of the controller in accordance with which the controller can regulate the current supplied to the load.

Figure 3:
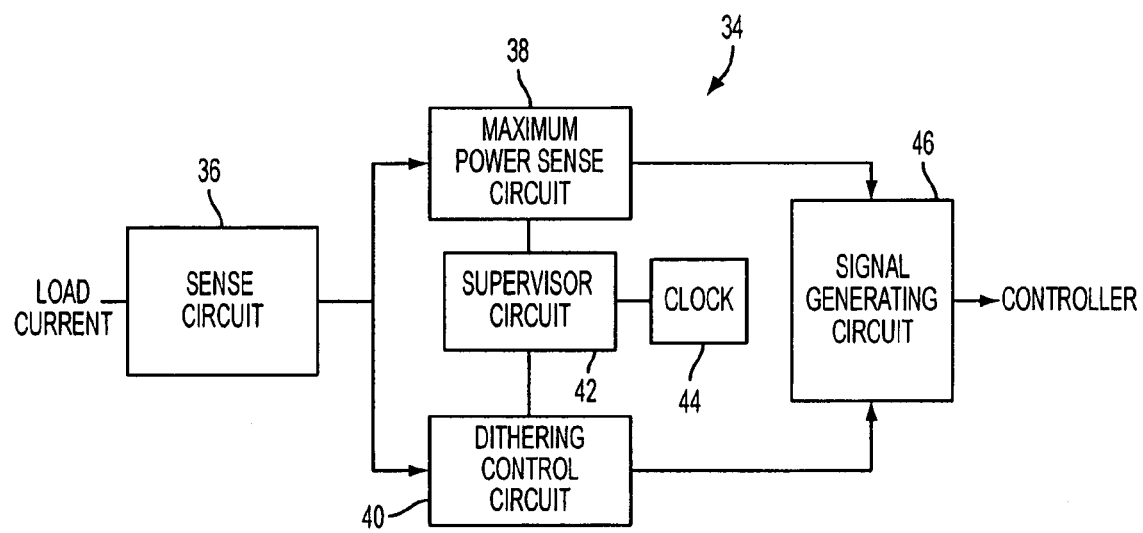
FIG. 3 is a block diagram of a power tracker circuit that may be utilized in the system of FIG. 2.

A block diagram of the power tracker circuit 34 is shown in FIG. 3. Sense circuit 36 may include the load current sense resistor 26 to provide a current signal that is proportional to load current. Alternatively, the sense circuit may include a multiplier to multiply measured output voltage by measured output current to derive output power. The output of sense circuit 36 is applied to maximum power sense circuit 38 and dithering control circuit 40. Maximum power sense circuit 38 and dithering control circuit 40 are coupled to, and under the control of, supervisor circuit 42, which is coupled to clock 44. Maximum power sense circuit 38 and dithering control circuit 40, when respectively activated by supervisor circuit 42, provide outputs to signal generating circuit 46. The signals generated by signal generating circuit 46 are applied to the current control input 35 of controller 32, which is responsive thereto to change the current control of the regulator.

Figure 4:
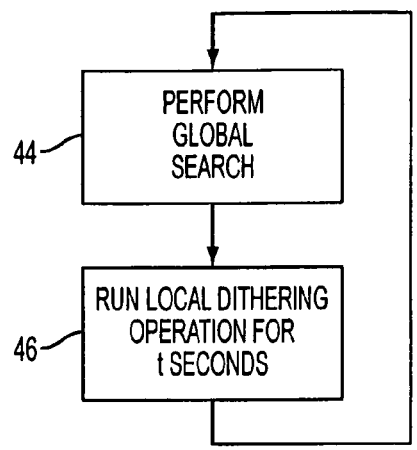
FIG. 4 is a general flow chart of the operation of the power tracker circuit of FIG. 3.

The supervisor circuit 42 operates in accordance with an algorithm illustrated in the flow chart of FIG. 4. The supervisor circuit effects continuous successive switching between a global maximum power search operation mode, illustrated by block 44, and a dithering mode of operation, illustrated by block 46. The maximum power sense circuit 38 is activated by the supervisor circuit during the global maximum power search mode of operation to identify operating point for maximum power at the time of activation. The dithering control circuit 40 is activated by the supervisor circuit for the dithering mode of operation after global search has been performed. In the dithering mode, the converter is operated at a current control input in the vicinity of the point of maximum power as determined in the global search mode. In accordance with timing signals provided by clock 44, the supervisor circuit sets run times for the dithering mode and the global search mode. The duty cycle of the global search mode can be as small as 0.1 per cent or less. Thus, the supervisor circuit periodically stops the local dithering mode and allows the global search to be performed.

Figure 5:
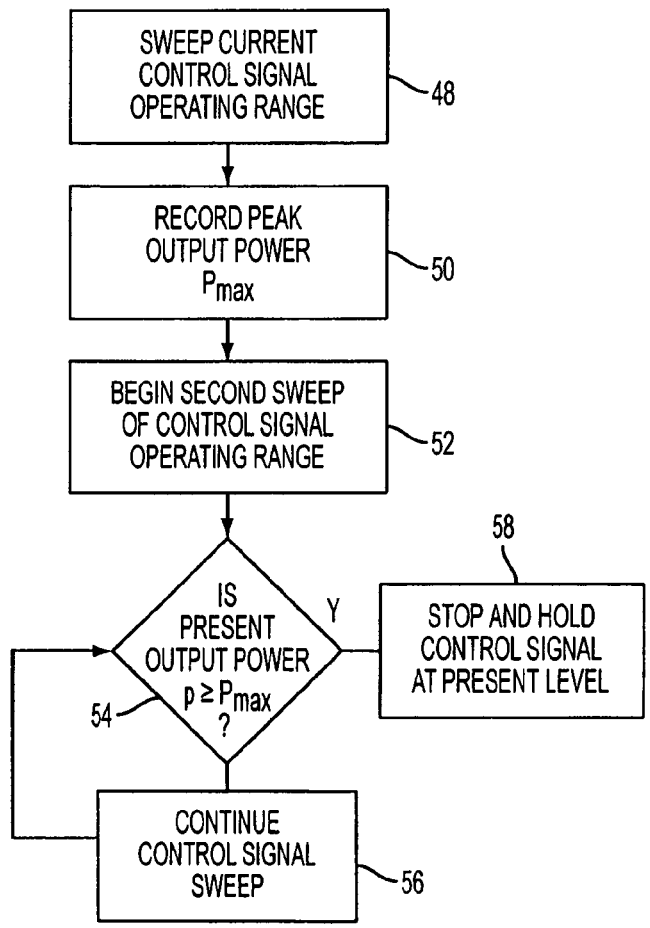
FIG. 5 is a flow chart of the global search mode portion of the operation of FIG. 4.

FIG. 5 is a flow chart illustrative of the global search mode operation. At step 48, the current control signal, output by signal generating circuit 46, sweeps through its entire range at a rapid pace while the converter responds accordingly to vary its output. The load current at resistor 26 is continuously sensed by sense circuit 36. During the sensing step 50, the maximum power sense circuit 38 detects the peak output power through a peak detector. At the completion of the sweep operation, the maximum power level has been determined and stored. At step 52, a second sweep of the operating range is initiated. During this second sweep, the output power is again sensed and compared with the maximum level determined during the first sweep. If the sensed power is less than the determined maximum level, the sweep operation continues at step 56 and power continues to be sensed and compared in step 54. When the sensed power approximates the stored maximum power, the sweep is stopped at step 58. The global search mode is terminated and the supervisor circuit changes operation to the dithering mode. The current control signal then generated and applied to controller input 35 is held as a nominal maximum power point initially applied in the following dithering mode operation.

Figure 6:
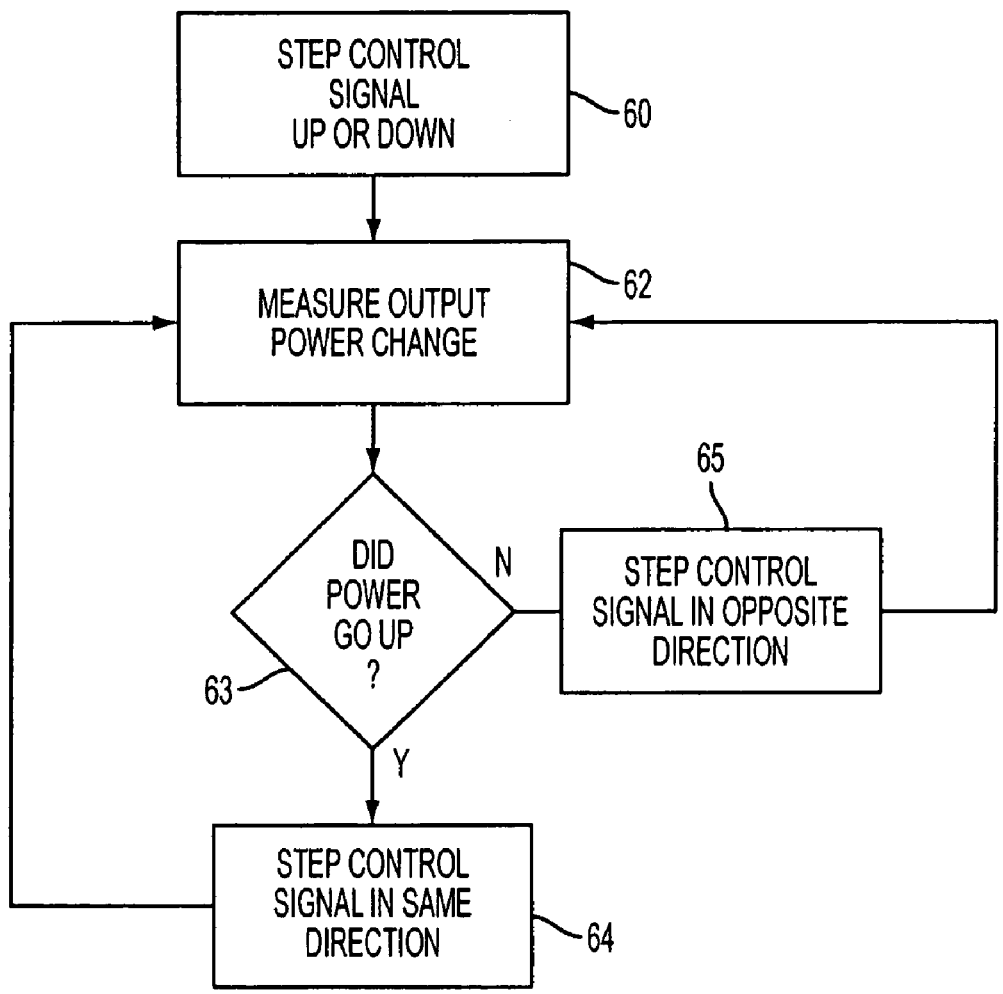
FIG. 6 is a flow chart of the dithering mode portion of the operation of FIG. 4.

As sunlight conditions are subject to change in an unpredictable manner, the maximum power level control point determined during the global search mode cannot be relied upon to be applicable for an extended time period. Thus, the global search is repeated at preset time intervals. Between global searches, dithering mode operation proceeds by changing the current control signal setting incrementally. Each dithering mode interval is divided, in response to the clock signals, into a plurality of cycles. During each cycle, the current control setting is changed in the manner illustrated in the dithering mode operation flow chart of FIG. 6. At step 60, the initial nominal maximum power current control signal setting is changed in an arbitrary direction, i.e., either increased or decreased. At step 62, the output power is sampled and the change in power is sensed. At step 63, determination is made as to whether there was an increase or decrease in the sensed power. A determination of increased power is indicative that the maximum power point has changed from the nominal point of the global search and that the direction of change in the control signal setting was appropriate. A determination of decreased power is indicative that (1) either the nominal point still represents the maximum power or (2) that the maximum power point has changed and the direction of change in the control signal was inappropriate.

If an increase in power was determined in step 63, the next incremental change of the current control signal setting is made in the same direction as the previous change, at step 64. The dithering operation then reverts back to step 62 to measure the change in power for the setting change of step 64. If a decrease in power was determined in step 63, the next incremental change of the current control signal setting is made at step 65, in the opposite direction of the previous change. Dithering operation then reverts back to step 62 to measure the change in power for the setting change of step 65. The dithering operation continues according to this process flow until the preset time interval elapses. At termination of the dithering mode, a new global search begins.

Figure 7:
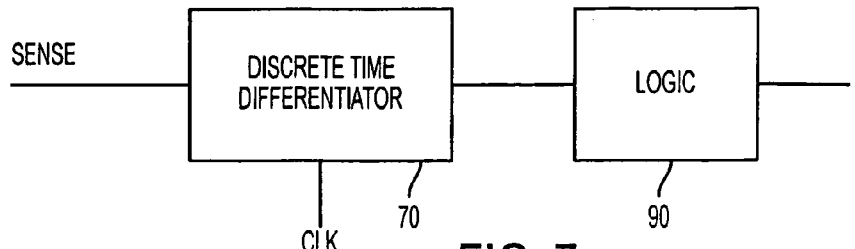
FIG. 7 is a general block diagram of the dithering control circuit that may be used in the power tracker circuit of FIG. 3.

FIG. 7 is a general block diagram of the dithering control circuit 40. A discrete time differentiator circuit 70 is coupled to logic circuit 90. The circuit 70 is responsive to clock signals to sample the sensed current at discrete time periods, or phases, during each dithering cycle. The purpose of this circuit is provide an indication of whether output power has increased or decreased, not the magnitude of the change. After sampling, a derivative output is produced that is indicative of the change in power between samples. The output of circuit 70 is latched in logic circuit 90. Logic circuit 70 outputs a signal that is indicative of the direction of power change since the previous sample. The output of logic circuit 70 is applied to the signal generating circuit 46 of power tracker circuit 34.

Figure 8:
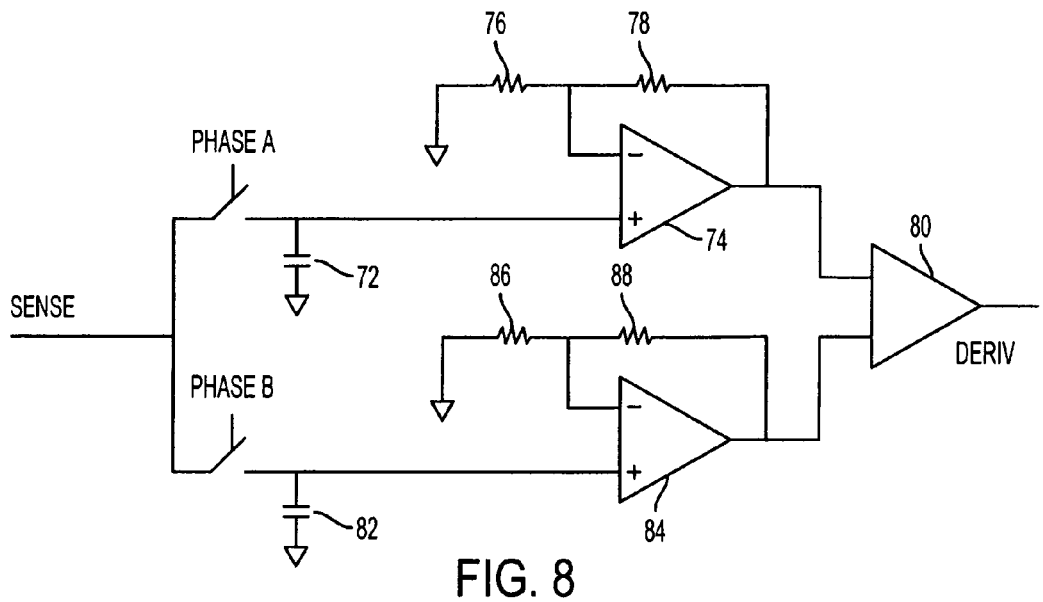
FIG. 8 is a circuit diagram of a discrete time differentiator circuit that may be used in the dithering control circuit of FIG. 7.

Discrete time differentiator circuit 70 is exemplified in FIG. 8. The input of the circuit receives the sense signal from sense circuit 36. Each dithering cycle is divided into a number of phases. During one of the phases of each cycle, designated "phase A," a switch is activated to charge capacitor 72. During one of the phases of each cycle, designated "phase B," a switch is activated to charge capacitor 82. The voltage levels of capacitors 72 and 82 are coupled, respectively, through non-inverting amplifiers 74 and 84 to the inputs of comparator 80. The gains of both amplifiers are set to be equal, via circuit connections to resistors 76, 78, 86 and 88.

A Linear Technology Corporation LT1671 comparator, for example, may be used for the comparator 80. The output of comparator 80, designated "Deriv," is a logic level generated in accordance with the difference between the outputs of amplifiers 74 and 84. If, after the phase A sampling, the voltage at capacitor 72 is greater than the voltage at capacitor 82, then power has increased. If the voltage at capacitor 82 is greater than the voltage at capacitor 72, then power has decreased. If, after the phase B sampling, the voltage at capacitor 82 is greater than the voltage at capacitor 72, then power has increased. If the voltage at capacitor 72 is greater than the voltage at capacitor 82, then power has decreased. The output of comparator 80, Deriv, thus represents the direction of power change, i.e., an increase or a decrease.

Figure 9:
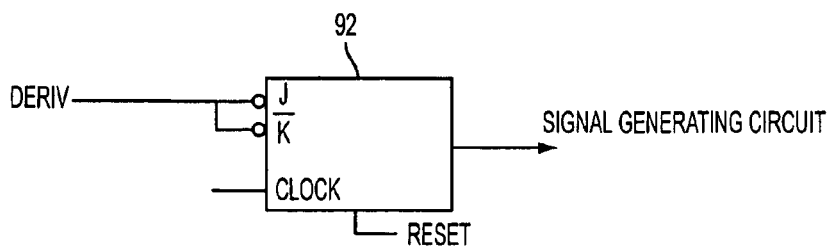
FIG. 9 is a block diagram of a logic element that may be used in the dithering control circuit of FIG. 7

The logic circuit 90 generates an output that represents the direction in which the current control signal must be changed, based on the received Deriv output from circuit 70 and the previous change of current control signal. Logic circuitry may be implemented with a JK flip-flop 92, or equivalent logic elements, as shown in FIG. 9. Both inverted inputs are tied together and coupled to receive the signal Deriv. The flip-flop is clocked by time signals derived via the supervisor circuit 42 from clock source 44. An input signal may be clocked to the flip-flop after each phase A and phase B sampling, or once in each dithering cycle, for example, after each phase B sampling. A high Deriv input signal is inverted at the J and K inputs and the output of the flip-flop will be unchanged. If the previous output was high and produced an increase in power, the high flip-flop output is maintained. If the previous output was low and produced an increase in power, the low flip-flop output is maintained. A low Deriv input signal is inverted at the J and K inputs and the output of the flip-flop will be changed. If the previous output was high and produced an decrease in power, a low flip-flop output is generated. If the previous output was low and produced an decrease in power, a high flip-flop output is generated. The JK flip-flop, configured as described above, is but one of many logic arrangements within the skill of the artisan that will produce the desired output functionality. For example, implementation may include a combination of exclusive OR gate and D flip-flop.

Figure 10:
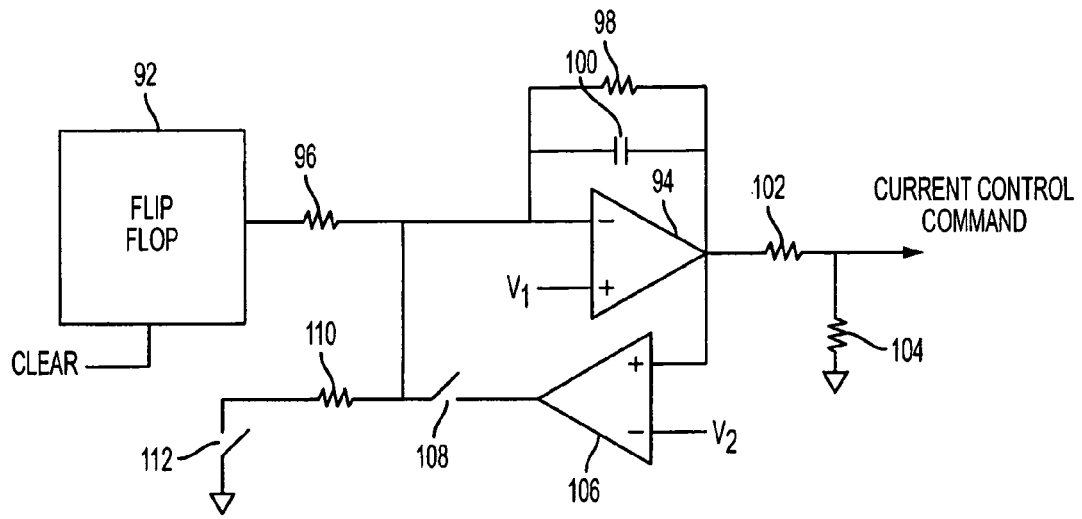
FIG. 10 is a block diagram of signal generating circuit that may be used in the power tracker circuit of FIG. 3.

FIG. 10 is a block diagram of signal generating circuit 46. The output of flip-flop 92 is coupled to a first input of operational amplifier 94 via resistor 96. Connected in parallel across the first input and the output of the operational amplifier are resistor 98 and capacitor 100. The operational amplifier, thus, is configured as an integrator, whose output is connected to ground through voltage divider resistors 102 and 104. The output of the signal generating circuit, taken at the junction of resistors 102 and 104, is coupled as a current control command to input 35 of controller 32. The second input of operational amplifier 94 is coupled to reference voltage $V_1$. The output of operational amplifier 94 is connected to a first input of operational amplifier 106. The second input of operational amplifier 106 is connected to reference voltage $V_2$. Switch 108 is connected between the output of operational amplifier 106 and the first input of operational amplifier 94. Resistor 110 and switch 112 are connected between the first input of operational amplifier 94 and ground. Reference voltage $V_1$ and the voltage divider resistors 102 and 104 are scaled to be compatible with the controller's supply and to prevent current control command from exceeding the maximum rating of the controller input 35.

In dithering mode operation, switches 108 and 112 are open. In each dithering cycle, the input to first input of operational will be higher or lower than the reference voltage at the second input, in dependence upon the output level of the flip-flop 92. The rate of voltage ramp for the integrator is dependent on the values of resistor 98 and capacitor 100. Capacitor 100, $V_1$, $V_{OL}$ and $V_{OH}$ determine the incremental change of voltage at the current control command output during each dithering cycle, wherein $V_{OL}$ and $V_{OH}$ are the output voltages of the flip flop 92 in the low and high states, respectively.

In the global search mode, the signal generating circuit functions to sweep the output operating point variable through its range. The supervisor circuit executes a global run operation, generating signals to clear flip-flop 92 and to close switch 112. The flip-flop output is forced to ground and the first input of operational amplifier 94 is connected to ground through resistor 110. The lowered resistance through this paralleled ground input increases the integrator ramp rate. The resistance values are selected to ensure that a full sweep of the current control command output will occur in a small time period, as compared with the time that the dithering mode is operational. Before each of the two sweeps in the global search mode, switch 108 is closed for a long enough period for the integrator output to be reset to the reference voltage $V_2$. The value of $V_2$ is selected to correspond to the minimum useful value of the output command.

Figure 11:
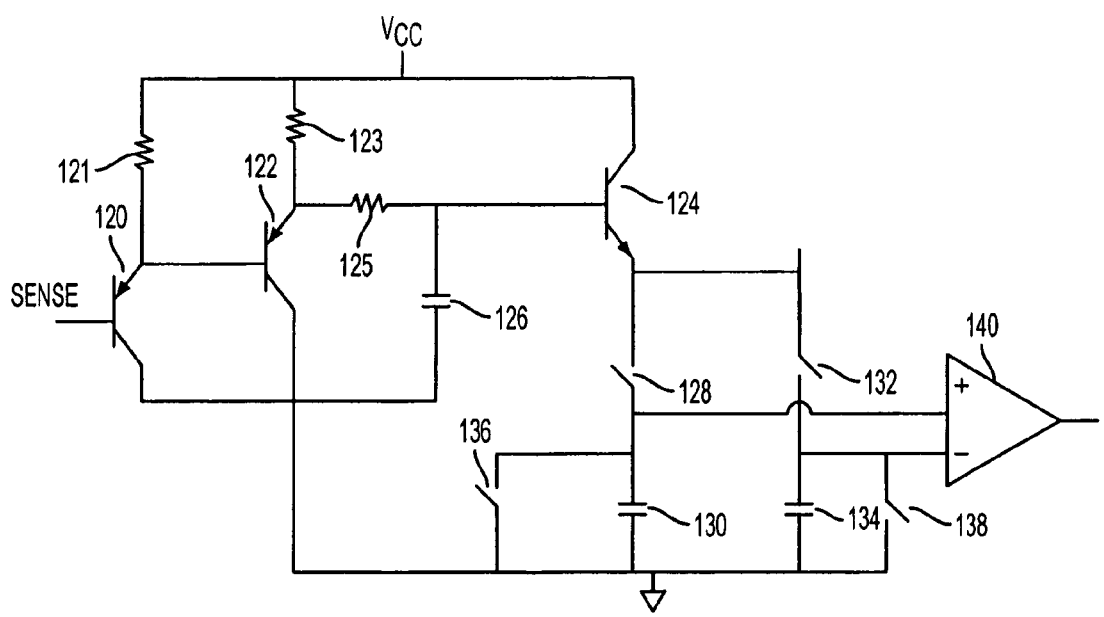
FIG. 11 is a circuit diagram of a maximum power sense circuit that may be used in the power tracker circuit of FIG. 3.

The maximum power sense circuit 38 may comprise peak detector circuitry as illustrated in FIG. 11. The load current sense signal is level shifted up through cascaded PNP transistors 120 and 122 and resistors 121 and 123. The shifted level is applied to the base of NPN peak detect transistor 124 via the filter comprising resistor 125 and capacitor 126. The collector of transistor 124 is coupled to the voltage supply Vcc. Coupled between the emitter of transistor 124 are two parallel paths, a series connection of switch 128 and capacitor 30, and a series connection of switch 132 and capacitor 134. Switch 136 is connected in parallel with capacitor 130. Switch 138 is connected in parallel with capacitor 134. A first input of comparator 140 is coupled to the junction of switch 128 and capacitor 130. A second input of comparator 140 is connected to the junction of switch 132 and capacitor 134. The output of comparator 140 is coupled to the supervisor circuit 42.

Capacitors 130 and 134 are peak detector capacitors that are charged during respective global sweeps. At the beginning of each global search, the supervisor outputs signals to switches 136 and 134 to short the capacitors to ground. At this time, also, switch 108 of maximum power sense circuit 38 is activated to set the current control command at its lowest level. When the first sweep begins, switches 108, 136 and 138 are deactivated and switch 128 is asserted and the capacitor 130 is connected to the peak detector transistor 124. The charge stored on capacitor 130 corresponds to the maximum power during the first sweep. Switch 128 is deactivated when the first sweep finishes. Then, switch 108 is again asserted to set the current control command back to its lowest level. The second sweep begins when switch 108 is deactivated and switch 132 is asserted to connect capacitor 134 to peak detector transistor 124. The charge stored on capacitor 130 corresponds to the power during the second sweep. Both capacitors are always connected to the comparator 140. The output of comparator 140 changes state when the voltage at capacitor 134 equals the voltage at capacitor 130. At that time, the current control command output of FIG. 10 is at a level that corresponds to the maximum power detected in the first sweep. This level is the nominal maximum power point of the control signal that will be initially set in the next dithering mode operation.

The supervisor circuit is responsive to the change in state of the output of comparator 140 to terminate the global search mode and initiate the next dithering mode. Switches 128, 132, 136 and 138 of FIG. 11 are in a de-asserted state, as are switches 108 and 106 of FIG. 10. A reset signal is no longer applied to flip-flop 92. The dithering mode commences with the current control command output remaining at the level set in the global search operation.

Figure 12:
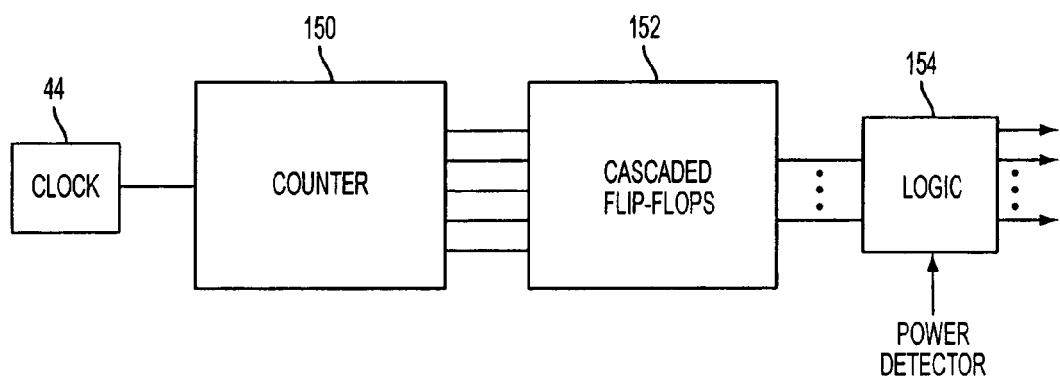
FIG. 12 is a block diagram of a supervisor circuit that may be used in the power tracker circuit of FIG. 3.

FIG. 12 is a block diagram of the supervisor circuit 42. The supervisor system generates the signals that enable and control the global search operation, and the phase signals for the dithering operation. Counter 150 divides the pulses received from clock 44 among several outputs that are fed to a cascaded flip-flop arrangement 152. As an example, the clock may have a frequency of 300 KHz. An 8-bit counter may be cascaded with a 14-bit counter to provide a period of fourteen seconds for the most significant bit (MSB) output. Additional counter outputs are combined with a cascade of D Flip-Flops 152 and logic circuit 154 to produce the signals applied to the switches in the dithering control circuit 40 and the maximum power sense circuit 38. The block diagram is merely illustrative as various specific implementations that are capable of producing the required timing signals are within the skill of the artisan.

In this disclosure there are shown and described only preferred embodiments of the invention and but a few examples of its versatility. It is to be understood that the invention is capable of use in various other combinations and environments and is capable of changes or modifications within the scope of the inventive concept as expressed herein. The invention is applicable to identifying, globally for a range of operation, a maximum or minimum value of a variable characteristic. The concepts of the present invention are not limited to the variable power characteristic exemplified in above description. The analog global tracking and control circuits are applicable to any characteristic that is variable through a range of operation.

With respect to variable power, the invention is applicable for tracking power of variable energy sources other than solar sources. Although a boost converter has been described, the invention is applicable to other known converters, such as buck and buck-boost converters. The current control signal adjustment may be used to vary duty cycle in constant frequency operation, or to vary frequency with constant or variable duty cycle operation.

What is claimed is:

1. A system comprising:
    a controllable apparatus having a characteristic that is variable over a range of operation; and
    a sensing circuit coupled to the apparatus and operative to sense the variable characteristic, the sensing circuit being configured for performing
    (1) first interrogation of the variable characteristic over the range of operation to identify a global maximum or minimum value (global value) of the variable characteristic, and
    (2) second interrogation of the variable characteristic over the range of operation to compare a value of the variable characteristic with the global value to set an operation point for the controllable apparatus.

2. A method for tracking a variable characteristic, comprising:
    sensing the level of the characteristic over an operating range;
    identifying an operating point in the operating range; and
    controlling an operating parameter in correspondence with the identified operating point in the operating range, wherein
    the identifying step includes (1) first interrogation of the characteristic over the range of operation to identify a global maximum or minimum value (global value) of the characteristic, and (2) second interrogation of the characteristic over the range of operation to compare a value of the characteristic with the global value to identify the operating point.

3. A control system for a variable power energy source comprising:
    a converter coupled between an output of the energy source and a load; and
    control circuit control circuitry coupled between the load and an input of the converter for controlling an operating parameter of the converter to obtain peak power from the energy source, the control circuitry comprising:
        a power sensing circuit having an input coupled to the load for sensing load power; and
        a maximum power sensing circuit coupled to the power sensing circuit for performing (1) first interrogation of the load power over a range of operation of the converter to identify global maximum power corresponding to the peak power, and (2) second interrogation of the load power over the range of operation of the converter to compare load power with the global maximum power so as to set a nominal peak converter power level;
        a signal generating circuit coupled to the maximum power sensing circuit for generating a control signal to control the operating parameter of the converter in accordance with the nominal peak converter power level.

4. A system as recited in claim 3, wherein the converter is a switching regulator comprising a switch and a controller for activating the switch, and the operating parameter is converter current.

5. A system as recited in claim 3, wherein the control circuitry further comprises
    a dither control circuit coupled to the power sensing circuit for adjusting the nominal peak converter power level, wherein
    the signal generating circuit generates the control signal to control the operating parameter of the converter in accordance with the adjusted nominal peak converter power level.

6. A system as recited in claim 5, wherein the dither control circuit comprises:
    a first storage device coupled to the load during a first sample period for establishing a voltage level corresponding to load power during the first sample period;
    a second storage device coupled to the load during a second sample period for establishing a voltage level corresponding to load power during the second sample period; and
    a comparator having a first input coupled to the first storage device and a second input coupled to the second storage device and an output, wherein the output of the comparator is indicative of whether load power has increased or decreased.

7. A system as recited in claim 6, wherein the dither control circuit further comprises a logic circuit coupled to the output of the comparator; wherein
    the logic circuit is configured to change states when the comparator output is indicative of a decrease in load power and to maintain its state when the comparator output is indicative of an increase in load power.

8. A system as recited in claim 7, wherein the signal generating circuit comprises an integrator coupled to the output of the logic circuit.

9. A system as recited in claim 5, wherein the control circuitry further comprises a supervisor module, and the maximum power tracking circuit comprises a peak detector circuit coupled to the supervisor module.

10. A system as recited in claim 9, wherein the peak detector circuit comprises:
   a first storage device coupled to the load during operation of the converter through a first sweep of a range of converter current control for establishing a voltage level corresponding to the global maximum power of the first interrogation;
   a second storage device coupled to the load during a second sweep of the converter current control range for storing a voltage level corresponding to the load power of the second interrogation; and
   a comparator having a first input coupled to the first storage device and a second input coupled to the second storage device and an output;
   wherein the comparator changes output states when the voltage level of the second capacitor approaches the level of the first capacitor during the second sweep.

11. A system as recited in claim 10, wherein the supervisor module comprises:
   a logic circuit having a first output coupled to the first storage device for activating the first storage device, a second output coupled to the second storage device for activating the second storage device and a third output for resetting the peak detector circuit.

12. A system as recited in claim 11, wherein the logic circuit is responsive to a change of state of the comparator to generate a reset signal at the third output.

13. A system as recited in claim 3, wherein the energy source is a solar source.

14. A method of attaining maximum power output from a variable power energy source, comprising the steps of:
   coupling the energy source to a converter having a variable range of operation in response to a converter control signal; and
   switching between a search mode operation and a dithering mode operation; wherein
   the search mode comprises determining a converter control signal level at which converter operation provides maximum power output, the determining step performing (1) first interrogation of the power output of the converter within a range of converter control to identify a global maximum power output, (2) second interrogation of the power output within the range of converter control to compare a power output with the global maximum power output so as to set the converter control signal level; and
   the dithering mode comprises:
   applying the converter control signal to the converter at the converter control signal level determined during the search mode;
   repeatedly sensing the power output of the converter at sampled intervals; and
   adjusting the converter control signal in accordance with sensed changes in power output.

15. A method as recited in claim 14, wherein the converter control signal is a current control signal.

16. A method as recited in claim 14, wherein the sensing step comprises:
   charging a first capacitor in proportion to the converter power output during odd numbered sampled intervals and charging a second capacitor in proportion to the converter power output during even numbered sampled intervals; and
   comparing the voltage levels of the first and second capacitors to determine whether power output has increased or decreased after a control signal adjustment.

17. A method as recited in claim 16, wherein the comparing step further comprises:
   generating a first comparison signal in accordance with the power output determination; and
   generating a second comparison signal in accordance with the first comparison signal and a previous control signal adjustment;
   and the adjustment step comprises integrating the second comparison signal.

18. A method as recited in claim 16, wherein the adjusting step comprises changing the level of the converter control signal in an upward or downward direction at predetermined intervals during dither mode operation;
   in response to a determination of increased power output in the comparing step, changing the converter control signal level in the same direction as the last previous adjustment; and
   in response to a determination of decreased power output in the comparing step, changing the converter signal level in the opposite direction to that of the last previous adjustment.

19. A method as recited in claim 18, wherein each converter control signal adjustment in the dither mode is by the same incremental amount in either direction.

20. A method as recited in claim 14, wherein the search mode determining step comprises:
   varying the converter control signal over a wide range during a first phase of search mode operation while measuring power output of the converter;
   storing a voltage value corresponding to the maximum global power output during the first phase;
   varying the converter control signal increasingly from its lowest value in its range during a second phase of operation while measuring power output of the converter;
   comparing a voltage value corresponding to the measured power during the second phase of operation with the stored voltage value obtained in the first phase; and
   setting the converter control signal value for the dithering mode at the level obtained in the comparison step.

21. A method as recited in claim 14, wherein switching between modes of operation continuously alternates between the search mode and dither mode and each dither mode operation is performed for substantially the same time duration.

22. A method as recited in claim 21, wherein the converter is a boost converter.

23. A method as recited in claim 22, wherein the converter is operated at a constant frequency.

24. A method as recited in claim 14, wherein the energy source is a solar source.

25. A system according to claim 1, wherein the sensing circuit terminates the second interrogation when a value of the variable characteristic substantially equal to the global value is obtained.

26. A system as recited in claim 1, wherein the characteristic that is variable over the range of operation has one maximum or minimum value within the range, or local maxima or minima values within the range.

27. A system as recited in claim 1, wherein the sensing circuit further configured for fine-adjusting the operating point in response to variation of the characteristic.

28. A system as recited in claim 1, wherein the controllable apparatus includes a solar panel.

29. A method according to claim 2, wherein the second interrogation is terminated when a value of the characteristic substantially equal to the global value is obtained.

30. A method as recited in claim 2, wherein the characteristic that is variable over the range of operation has one maximum or minimum value within the range, or local maxima or minima values within the range.

31. A method as recited in claim 2, further comprising fine-adjusting the operating point in response to variation of the characteristic.

* * * * *